(12) United States Patent
Kiyose et al.

(10) Patent No.: US 6,429,901 B1
(45) Date of Patent: Aug. 6, 2002

(54) PLL CIRCUIT AND PHASE LOCK DETECTOR

(75) Inventors: Masashi Kiyose, Gifu; Hiroya Ito, Hashima, both of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/009,484

(22) Filed: Jan. 20, 1998

(30) Foreign Application Priority Data

Jan. 23, 1997 (JP) .............................................. 9-010662
Jan. 30, 1997 (JP) .............................................. 9-016615

(51) Int. Cl.[7] .............................................. H04N 9/455
(52) U.S. Cl. ...................... 348/500; 348/505; 348/536; 348/537; 331/17; 331/25
(58) Field of Search ................................. 348/505, 510, 348/516–520, 536, 537; 327/148–157; 331/11, 28, 17; H04N 9/448

(56) References Cited

U.S. PATENT DOCUMENTS

| | | | |
|---|---|---|---|
| 4,167,711 A | | 9/1979 | Smoot .......................... 331/17 |
| 4,404,583 A | * | 9/1983 | Tatami ......................... 348/539 |
| 4,546,330 A | | 10/1985 | Okada .......................... 331/17 |
| 4,714,900 A | * | 12/1987 | Sata ............................. 331/8 |
| 4,885,554 A | * | 12/1989 | Wimmer ....................... 331/25 |
| 5,144,156 A | * | 9/1992 | Kawasaki ..................... 307/262 |
| 5,220,294 A | * | 6/1993 | Ichikawa ...................... 331/17 |
| 5,302,919 A | * | 4/1994 | Abe ............................. 331/2 |
| 5,304,953 A | | 4/1994 | Heim et al. ..................... 331/1 |

(List continued on next page.)

FOREIGN PATENT DOCUMENTS

| | | | | |
|---|---|---|---|---|
| EP | 0 306 993 A1 | | 11/1989 | ............ H04N/9/45 |
| EP | 0527603 | * | 2/1993 | |
| JP | 55-19252 | | 2/1980 | |
| JP | 56-020338 | | 2/1981 | ............ H03L/7/08 |
| JP | 57--186838 | | 11/1982 | ............ H03L/7/08 |
| JP | 58-038035 | | 3/1983 | ............ H03L/7/06 |
| JP | 60-145728 | | 8/1985 | ............ H03L/7/18 |
| JP | 63-263920 | | 10/1988 | ............ H03L/7/08 |
| JP | 04-207631 | | 7/1992 | ........... H03L/7/085 |
| JP | 05-153632 | | 6/1993 | ........... H04N/11/04 |

(List continued on next page.)

OTHER PUBLICATIONS

Herbst, "Digital Phase Locked Loop with loss of Lock Monitors," *Electrical Design News*, 6(20): 64–65 (1971).
Connelly et al "Phase–locked Loop includes lock indicator," *Designer's casebook*, 47(18): 112–113 (1974).
Japanese Office Action for Japanese Publication No. 09–16615 dated Sep. 11, 2001.
Japanese Office Action for Japanese Publication No. 09–10662 dated Sep. 11, 2001.

*Primary Examiner*—John W. Miller
*Assistant Examiner*—Linus H. Lo
(74) *Attorney, Agent, or Firm*—Sheridan Ross PC

(57) ABSTRACT

A PLL circuit which outputs an oscillation clock signal synchronous with a reference clock includes a phase lock detector for detecting if the oscillation lock signal is synchronous with the reference clock. If the phase lock detector detects a phase difference between the oscillation clock signal and the reference clock, a charge pump circuit is used to alter the oscillation clock signal so that the oscillation signal is placed back in sync with the reference clock. The charge pump selects one of a ground potential and a power supply potential in response to a comparison result of the oscillation clock signal and the reference clock. The charge pump pulls a constant current to ground from an output terminal of the charge pump ,circuit when the ground potential is selected and supplies a constant current to the output terminal of the charge pump circuit when the power supply potential is selected, thereby producing an output which alternately repeats the ground potential and the power supply potential.

7 Claims, 9 Drawing Sheets

U.S. PATENT DOCUMENTS

| | | | | |
|---|---|---|---|---|
| 5,339,050 A | * | 8/1994 | Llewellyn | 331/16 |
| 5,359,298 A | * | 10/1994 | Abe | 331/2 |
| 5,475,326 A | * | 12/1995 | Masuda | 327/157 |
| 5,608,463 A | * | 3/1997 | Ohmori | 348/540 |
| 5,642,082 A | * | 6/1997 | Jefferson | 331/25 |
| 5,699,020 A | * | 12/1997 | Jefferson | 331/17 |
| 5,740,213 A | * | 4/1998 | Dreyer | 375/374 |
| 5,781,048 A | * | 7/1998 | Nakao et al. | 327/157 |
| 5,809,095 A | * | 9/1998 | Nakao | 375/374 |
| 5,854,575 A | * | 12/1998 | Fiedler et al. | 331/10 |
| 5,892,407 A | * | 4/1999 | Ishii | 331/17 |
| 5,939,947 A | * | 8/1999 | Nakao et al. | 331/11 |
| 5,959,502 A | * | 9/1999 | Ovens et al. | 331/8 |
| 5,982,836 A | * | 11/1999 | Sakae et al. | 375/376 |
| 6,014,176 A | * | 1/2000 | Nayebi et al. | 348/539 |
| 6,041,090 A | * | 3/2000 | Chen | 375/376 |
| 6,054,903 A | * | 4/2000 | Fiedler | 331/17 |
| 6,175,285 B1 | * | 1/2001 | Gabara | 331/117 R |
| 6,177,844 B1 | * | 1/2001 | Sung et al. | 331/25 |
| 6,211,920 B1 | * | 4/2001 | Cirot et al. | 348/533 |
| 6,222,421 B1 | * | 4/2001 | Kiyose | 331/17 |

FOREIGN PATENT DOCUMENTS

| | | | |
|---|---|---|---|
| JP | 06-085664 | 3/1994 | H03L/7/093 |
| JP | 07-030416 | 1/1995 | H03L/7/107 |
| JP | 08-116254 | 7/1996 | H03L/7/12 |
| JP | 10/209859 | 8/1998 | H03L/7/093 |
| WO | WO 95/04405 | 2/1995 | H03L/7/089 |

* cited by examiner

Fig.3A S1 ⎯⎧⎫⎧⎫⎧⎫⎧⎫⎧⎫⎧⎫⎯  Vt>VDD/2

Fig.3B S1 ⎯⎧⎫⎧⎫⎧⎫⎧⎫⎧⎫⎧⎫⎯  Vt=VDD/2

Fig.3C S1 ⎯⎧⎫⎧⎫⎧⎫⎧⎫⎧⎫⎧⎫⎯  Vt<VDD/2

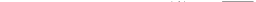
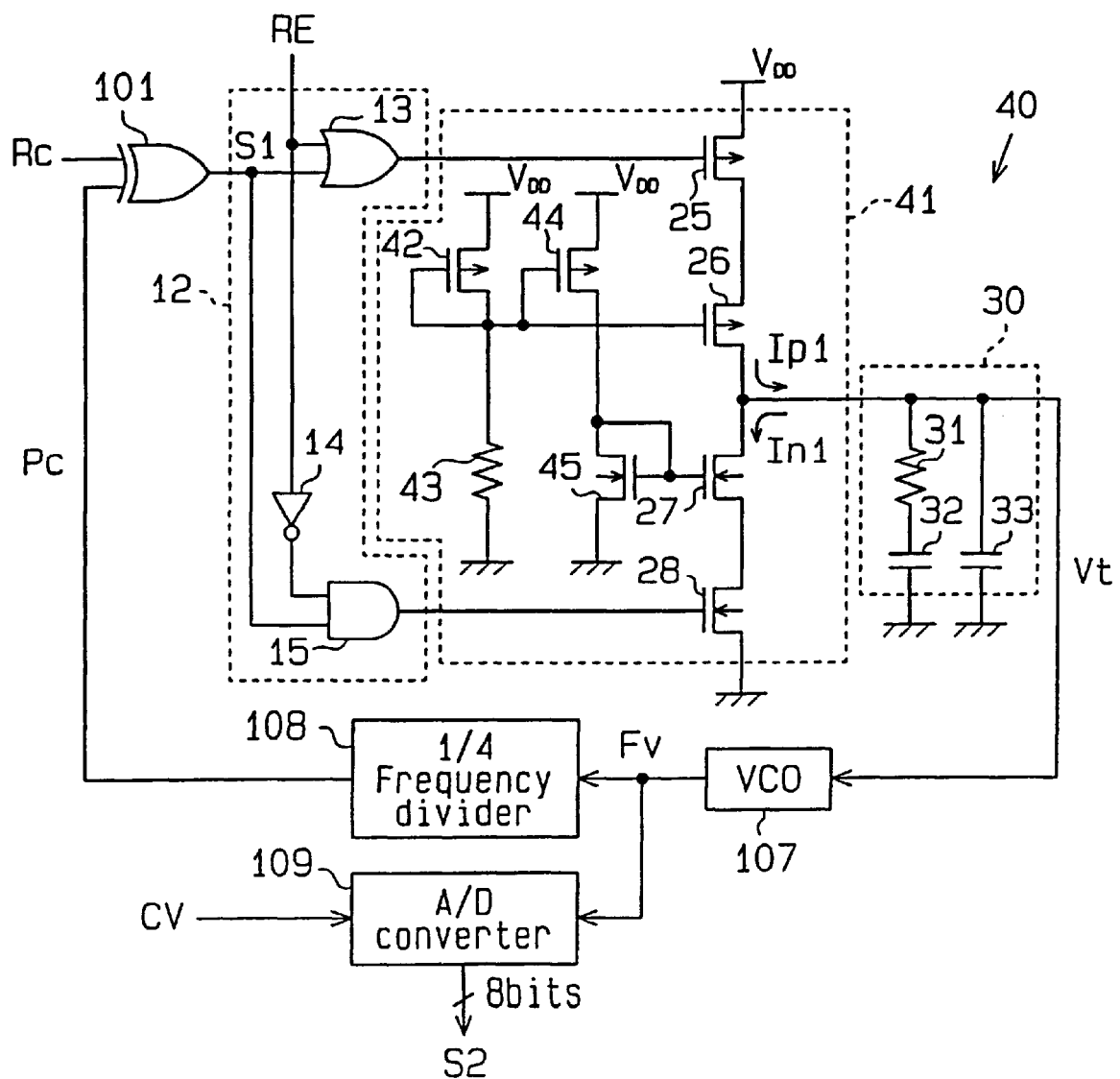

US 6,429,901 B1

PLL CIRCUIT AND PHASE LOCK DETECTOR

BACKGROUND OF THE INVENTION

The present invention relates generally to a PLL (Phase Locked Loop) circuit which outputs an oscillation clock synchronous with a reference clock, and a phase lock detector. More particularly, the present invention relates to a PLL circuit which maintains synchronization of a reference clock with an oscillation clock, and a lock detector which detects that the oscillation clock is synchronous with the reference clock.

In video applications, PLL circuits are used in synchronous reproduction of a color signal according to a burst clock included in a composite video signal. There are two types of PLL circuits: a digital circuit type and an analog circuit type. The digital PLL circuit has a CMOS structure and includes a memory for storing data of the oscillation timing of an oscillation clock, a digital filter and a multiplier. The digital PLL circuit therefore has a relative large circuit area. The analog PLL circuit has a CMOS structure and includes an external component like a capacitor. The analog PLL circuit is thus smaller than its digital counterpart.

FIG. 1 is a block diagram of a conventional analog PLL circuit 100 for use in a television receiver. The PLL circuit 100 includes an exclusive OR (XOR) gate 101, a tristate buffer 102, a charge pump circuit 103 or a CMOS structure, a low-pase filter (LPF) 106, a Voltage controlled oscillator (VCO) 107 and a ¼ frequency divider 108.

The XOR gate 101 has a first input terminal for receiving a burst clock (reference clock) Rc with a duty ratio of 50%, a second input terminal for receiving an output clock Pc with a duty ratio of 50% output from the ¼ frequency divider 107, and an output terminal for outputting a clock Si which represents the result of comparison of the phase of the burst clock RC with that of the output clock Pc. FIG. 2 is a timing diagram illustrating the operation of the XOR 101. In a color television of the NTSC (National Television System Committee) system, the burst clock Rc has a frequency of 3.58 MHZ. When the period of the burst clock Rc matches with that of the output clock Pc and when the phase of the output clock Pc in advanced by 90° from that of the burst clock Re, the clock 81 which has a frequency double that of the burst clock Rc and a duty ratio of 50% is output (see FIG. 2).

The tristate buffer 102 receives a control signal RE, which is enabled in accordance with the period of the burst clock, and the output clock Si. The tristate buffer 102 sends the output clock S1 to the charge pump circuit 103 when the control signal RE is enabled to have an "H level" and sets the output in a high impedance state when the control signal RE is enabled to have an "L level".

The charge pump circuit 103 includes a pMOS transistor 104 and an nMOS transistor 105, connected in series between a power supply and ground. The pMOS transistor 104 and nMOS transistor 105 are turned on or off in response to the output clock S1 output by the tristate buffer 102. When the pMOS transistor 104 is on, a current Ip flows into the LPF 100 from the power supply, and when the nMOS transistor 105 is on, a current In flows through the LPF 106 into ground. As the LPF 106 is charged or discharged by the current Ip or In, the LPF 106 smoothes the clock S1 and outputs a control voltage Vt to the VCO 107. The VCO 107 supplies an oscillation clock Fv having a frequency according to the voltage value of the control voltage Vt to the ¼ frequency divider 108. In the case of television, the oscillation clock Fv has a frequency of 14.31818 MHZ, four times as high as the frequency of the burst clock Rc. The ¼ frequency divider 108 sends the clock Pc, obtained by frequency-dividing the oscillation clock Fv by four, to the XOR gate 101.

An A/D converter 109 receives the oscillation clock Fv from the VCO 107, and performs analog-to-digital conversion to generate a digital signal S2 by sampling a composite video signal CV according to the oscillation clock Fv. The composite video signal CV includes a color signal which is extracted by the AID converter 109.

The frequency of the oscillation clock Fv output from the VCO 107 varies due to external factors such as a temperature change and a change in power supply potential. To suppress a change in the frequency of the oscillation clock Fv or to obtain the oscillation clock Fv of a constant frequency from the VCO 107, the control voltage Vt should be adjusted in accordance with such external factors. One way of controlling the control voltage Vt is to change the duty ratio of the output clock S1 of the XOR gate 101. This is because the control voltage Vt is output as the LPF 106 is charged or discharged by the operation of the charge pump circuit 103, according to the duty ratio of the output clock S1.

Suppose that the control voltage Vt which is one-half the power supply potential is acquired when an ideal clock S1 with a duty ratio of 50% is output, as shown in FIG. 3B. To set the control voltage Vt larger than one-half the power supply potential, as shown in FIG. 3A, it is necessary to output the clock S1 whose duty ratio is greater than 50%. To set the control voltage Vt smaller than one-half the power supply potential, as shown in FIG. 3C, the clock S1 whose duty ratio is smaller than 50% should be output. In the cases of FIGS. 3A and 3C, since the difference between the phase of the burst clock Rc and the phase of the clock Pc is not 90°, the phase of the oscillation clock Fv is shifted from the desired phase.Sampling of a video signal according to the oscillation clock Fv with the shifted phase makes it difficult to accurately reproduce a color signal, resulting in a change in color.

In the television receiver, various signal processes are executed using the oscillation clock Fv from the PLL circuit 100. When the oscillation clock Fv is shifted at the time the receiver is powered on or the channel is changed, various signal processes may not be carried out properly. It is therefore desirable to detect if the oscillation clock Fv keeps a predetermined phase.

It is a primary objective of the present invention to provide a PLL circuit which maintains an oscillation clock synchronous with a reference clock.

It is a secondary objective of the present invention to provide a lock detector which detects that the oscillation clock is synchronous with the reference clock.

SUMMARY OF THE INVENTION

Briefly stated, the present invention provides a phase locked loop (PLL) circuit for generating an oscillation clock which maintains a substantially constant phase difference with respect to a phase of a reference clock. The PLL circuit includes: a voltage controlled oscillator receiving a control voltage and producing an oscillation clock having a frequency corresponding to the control voltage; a comparison circuit receiving the reference clock and the oscillation clock and comparing phases of the reference clock and the oscillation clock with each other to produce a comparison signal indicative of a comparison result; a charge pump circuit, connected to the comparison circuit, a ground potential and a power supply potential, for receiving the comparison signal, and selecting one of the ground potential and the power supply potential in response to the comparison signal, wherein the charge pump pulls a constant current to ground from an output terminal of the charge pump circuit when the ground potential is selected and supplies a constant current to the output terminal of the charge pump circuit when the power supply potential is selected, thereby producing an output which alternately repeats the ground potential and the power supply potential; and a low-pass filter, connected between the charge pump circuit and the voltage controlled oscillator, for smoothing the output of the charge pump circuit to produce the control voltage. The charge pump circuit includes: first and second transistors which are alternately turned on and off in response to the comparison signal; a constant current source for supplying a constant current; a first current mirror circuit, connected between the first transistor and the output terminal of the charge pump circuit, for allowing flow of a constant drive current according to the constant current or the constant current source when the first transistor is turned on; and a second current mirror circuit, connected between the second transistor and the output terminal of the charge pump circuit, for allowing flow of a constant drive current according to the constant current of the constant current source when the second transistor is turned on.

The present invention further provides a phase locked loop (PLL) circuit for generating an oscillation clock which maintains a substantially constant phase difference with respect to a phase of a reference clock, The PLL circuit includes: a voltage controlled oscillator receiving a control voltage and producing an oscillation clock having a frequency corresponding to the control voltage; a comparison circuit receiving the reference clock and the oscillation clock and comparing phases of the reference clock and the oscillation clock with each other to produce a comparison signal indicative of a comparison result; a first charge pump circuit, connected to the comparison circuit, a ground potential and a power supply potential, for receiving the comparison signal, and selecting one of the ground potential and the power supply potential in response to the comparison signal, wherein the first charge pump circuit pulls a constant current to ground from an output terminal of the first charge pump circuit when the ground potential is selected and supplies a constant current to the output terminal of the first charge pump circuit when the power supply potential is selected, thereby producing a first output which alternately repeats the ground potential and the power supply potential; a second charge pump circuit, connected to the comparison circuit, a ground potential and a power supply potential and having a drive performance with a higher output load than the first charge pump circuit, for receiving the comparison signal, and selecting one of the ground potential and the power supply potential in response to the comparison signal, wherein the second charge pump circuit pulls a constant current to ground from an output terminal of the second charge pump circuit when the ground potential is selected and supplies a constant current to the output terminal of the second charge pump circuit when the power supply potential is selected, thereby producing a second output which alternately repeats the ground potential and the power supply potential; a low-pass filter, connected between the first and second charge pump circuits and the voltage controlled oscillator, for smoothing one of the first and second outputs of the first and second charge pump circuits to produce the control voltage; a lock detector receiving the reference clock and the oscillation clock, detecting if the oscillation clock maintains a substantially constant phase difference with respect to the phase of the reference clock and producing a detection signal indicative of a detection result; and a selecting circuit, connected to the first and second charge pump circuits and responsive to the detection signal, for operating the first charge pump circuit when the oscillation clock maintains the substantially constant phase difference with respect to the phase of the reference clock and operating the second charge Pump circuit when the oscillation clock does not maintain the substantially constant phase difference with respect to the phase of the reference clock.

The present invention provides a phase locked loop (PLL) circuit for generating an oscillation clock which maintains a substantially constant phase difference with respect to a phase of a reference clock. The PLL circuit includes: a voltage controlled oscillator receiving a control voltage and producing an oscillation clock having a frequency corresponding to the control voltage; a comparison circuit receiving the reference clock and the oscillation clock and comparing phases of the reference clock and the oscillation clock with each other to produce a comparison signal indicative of a comparison result; a charge pump circuit, connected to the comparison circuit, a ground potential and a power supply potential, for receiving the comparison signal, and selecting one of the ground potential and the power supply potential in response to the comparison signal, wherein the charge pump circuit pulls a constant current to ground from an output terminal of the charge pump circuit when the ground potential is selected and supplies a constant current to the output terminal of the charge pump circuit when the power supply potential i selected, thereby producing an output which alternately repeats the ground potential and the power supply potential; a low-pass filter, connected between the charge pump circuit and the voltage controlled oscillator, for smoothing the output of the charge pump circuit to produce the control voltage; a lock detector for receiving the reference clock and the oscillation clock, detecting if the oscillation clock maintains a substantially constant phase difference with respect to the phase of the reference clock and producing a signal indicative of a detection result; and a switch, connected to one of the input and output of the low-pass filter and responsive to the signal indicative of the detection result from the lock detector, the switch operating to supply one of the ground potential and the power supply potential to one of the input and output of the low-pass filter when the oscillation clock does not maintain a substantially constant phase difference with respect to the phase of the reference clock for at least a predetermined time.

The present invention further provides a lock detector for use in a phase locked loop circuit and for detecting if an oscillation clock maintains a substantially constant phase difference with respect to a phase of a reference clock, the oscillation clock having a frequency n (n: a natural number) times that of the reference clock, a first clock, obtained by dividing the frequency of the oscillation clock by n, supplied to the lock detector. The lock detector includes: a phase shifter for shifting a phase of the first clock by the substantially constant phase difference to produce a second clock; an exclusive OR gate, connected to the phase shifter, for receiving the reference clock and the second clock, and for producing an arithmetic operation output signal having a duty ratio; a low-pass filter for receiving and smoothing the arithmetic operation output signal to produce an output voltage according to the duty ratio of the arithmetic operation output signal; and a determining circuit, connected to the low-pass filter, for comparing the output voltage with a predetermined reference voltage and determining a locked state of the oscillation clock based on a comparison result.

The present invention provides an image signal processing apparatus for producing chrominance information and luminance information from a composite video signal containing a sync component, a luminance component and a chrominance component, The image signal processing apparatus includes: a sync signal detector for acquiring a horizontal sync signal indicative of a timing for a horizontal scan, from the sync component contained in the composite video signal; an burst extracting;circuit for extracting a burst clock indicative of a phase of the chrominance component, from the composite video signal; a Y/C separator for separating the luminance component and the chrominance component from the composite video signal; a phase locked loop circuit, connected to the/burst extracting circuit, for receiving the burst clock as a reference clock and producing an oscillation clock having a frequency n (n: a natural number) times that of the burst clock and maintaining a substantially constant phase difference with respect to a phase of the burst clock; a reproducing circuit, connected to the Y/C separator and the phase locked loop circuit, for receiving the luminance component and the chrominance component in accordance with the oscillation clock and reproducing the luminance information and the chrominance information; a frequency divider, connected to the phase locked loop circuit. for frequency-dividing the oscillation clock by n to produce a frequency-divided clock; and a lock detector, connected to the frequency divider and the burst extracting circuit, for receiving the burst clock and the frequency-divided clock and detecting a locked state of the phase locked loop circuit based on a phase difference between the burst clock and the frequency-divided clock. The lock detector includes; a phase shifter for shitting a phase of the frequency-divided clock by the constant phase difference to produce a phase shift clock: a logic gate. connected to the phase shifter, for receiving the reference clock and the phase shift clock and producing an arithmetic operation output signal having a certain duty ratio; a low-pass filter for receiving and smoothing the arithmetic operation output signal to produce an output voltage according to the duty ratio of the arithmetic operation output signal; and a determining circuit, connected to the low-pass filter, for comparing the output voltage with a predetermined reference voltage and supplying a reset signal to the phase locked loop circuit when the output voltage exceeds the predetermined reference voltage, Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which;

FIGS. 3A through 3C show the waveforms of a clock signal output from the XOR gate when the control voltage in the PLL circuit in FIG. 1 is altered;

FIGS. 6A through 6C show waveforms of a clock signal output from the XOR gate when the control voltage in the PLL circuit in FIG. 4 is altered;

FIG. 7 is a schematic block diagram of a PLL circuit according to a second embodiment of the present invention;

DETAILED DESCRIPTION OF THE PREFERRED EMBODIMENTS

Figure 1:
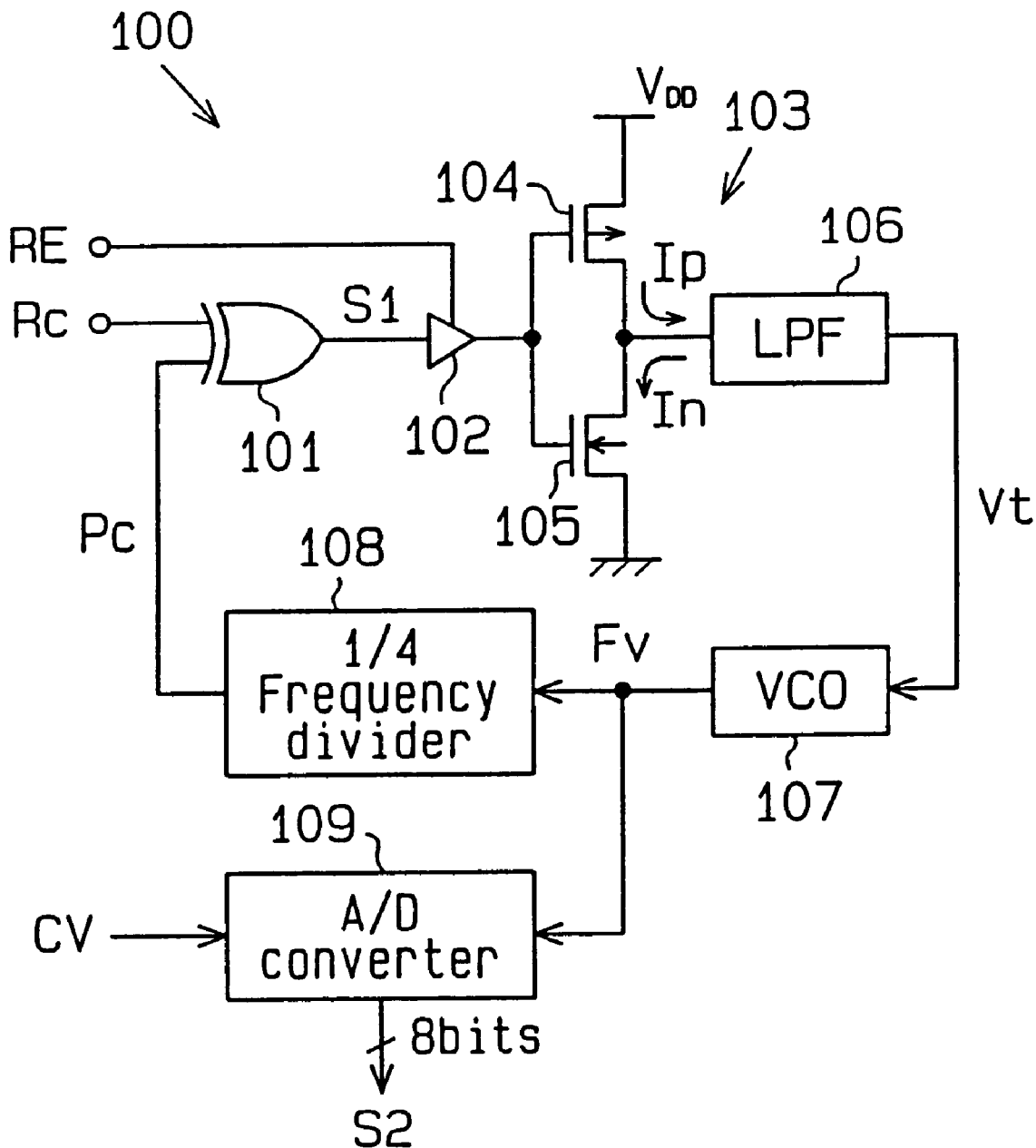
FIG. 1 is a schematic block diagram of a conventional PLL circuit.
Figure 2:
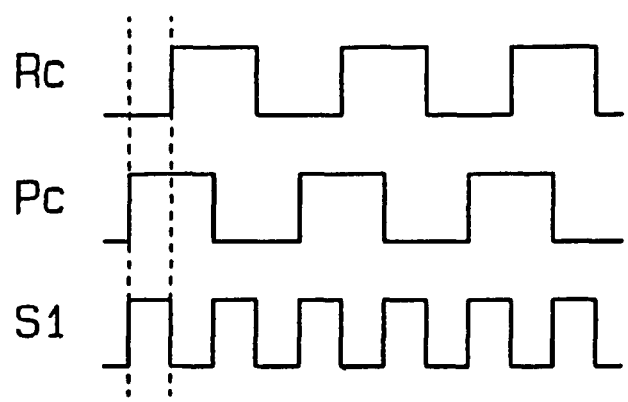
FIG. 2 is a waveform chart showing the operation of an XOR gate in the PLL circuit in FIG. 1.
Figure 4:
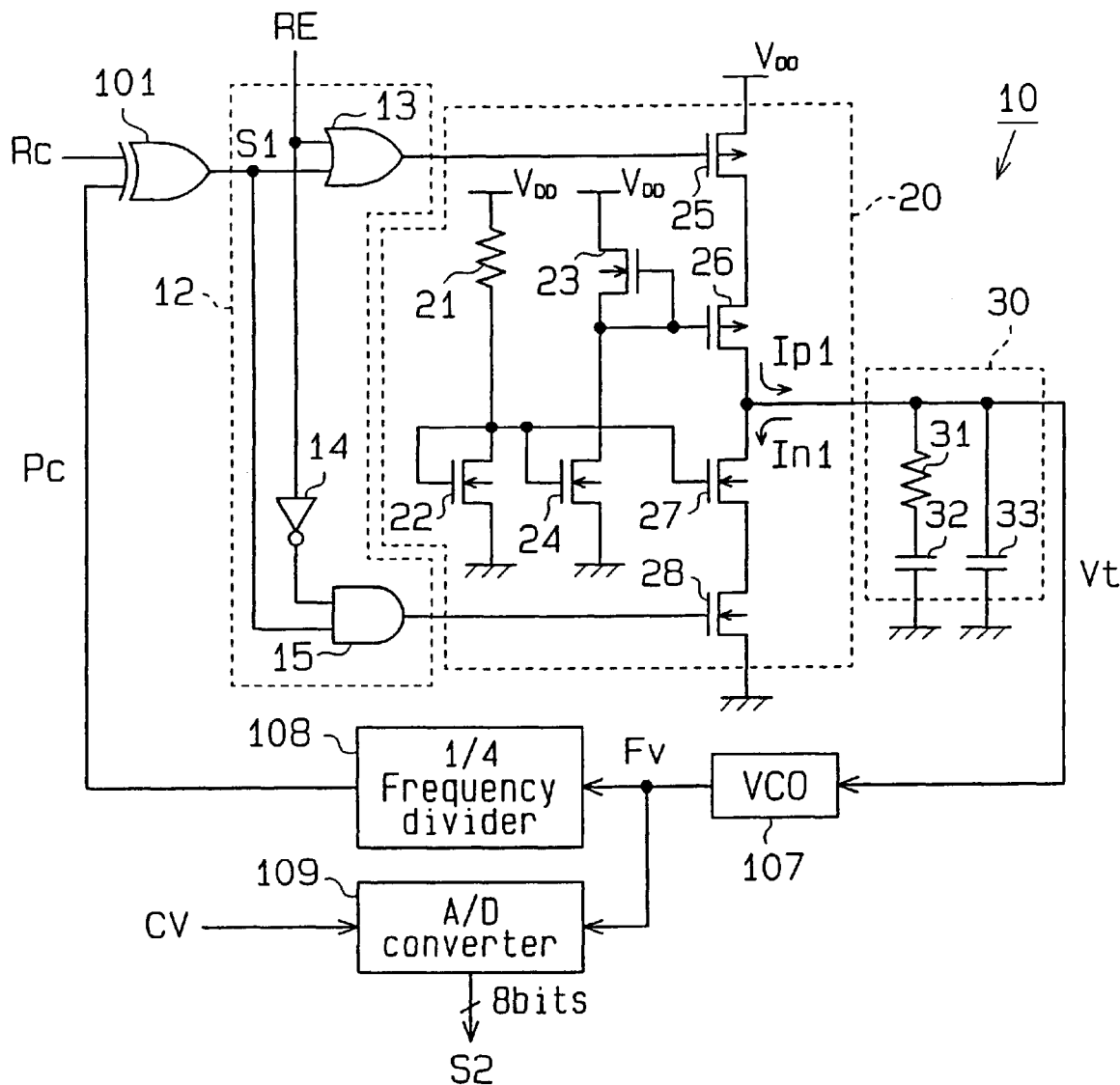
FIG. 4 is a schematic block diagram of a PLL circuit according to a first embodiment of the present invention.

In the drawings, like numerals indicate like elements throughout. FIG. 4 presents a block diagram of a PLL circuit 10 according to a first embodiment or the present invention. The PLL circuit 10 is of an analog type and has a CMOS structure. The PLL circuit 10 includes an XOR gate 101, a tristate buffer 12, a charge pump circuit 20 of a steady current type, a low-pass filter (LPF) 30, a VCO 107 and a ¼ frequency divider 108.

The XOR gate 101 has a first input terminal for receiving a burst clock (reference clock) Rc with a duty ratio of 50%, a second input terminal for receiving an output clock PC with a duty ratio of 50% output from the ¼ frequency divider 107, and an output terminal for outputting a clock 51 which represents the result of Comparison of the phase of the burst clock RC with that of the output clock Pc. In a color television of the NTSC system, the burst clock RC has a frequency of 3.58 MHZ. When the phase of the output clock PC is advanced by 90° from that of the burst clock Rc, the XOR gate 101 outputs the clock S1 which has a frequency double that of the burst clock Rc: and a duty ratio of 50%.

The tristate buffer 12 includes an OR gate 13, an inverter 14 and an AND gate 15. The OR gate 13 has a first input terminal for receiving a control signal RE which indicates a period in which the burst clock Rc is superimposed on a composite video signal, and a second input terminal for receiving the clock S1. The OR gate 13 supplies the clock S1 to the charge pump circuit 20 when the L-level control signal RE is output. When the H-level control signal RE is output, the OR gate 13 supplies an H-level signal to the charge pump circuit 20.

The AND gate 15 has a first input terminal for receiving the control signal RE via the inverter 14, and a second input terminal for receiving the clock S1. The AND gate 15 supplies the clock S1 to the charge pump circuit 20 when receiving an H-level output signal (L-level control signal RE) from the inverter 14. When receiving an L-level output signal (H-level control signal RE) from the inverter 14, the AND gate 15 supplies an L-level signal to the charge pump circuit 20.

The charge pump circuit 20 includes a resistor 21, nMOS transistors 22, 24, 27 and 28, and pMOS transistors 23, 25 and 26. The nMOS transistor 22 has a drain connected via the resistor 21 to the power supply, a source connected to ground, and a gate connected to its own drain. The resistor 21 and the nMOS transistor 22 form a constant current source. A voltage obtained by voltage division in accordance with the resistance of the resistor 21 and the ON resistance of the nMOS transistor 22 is applied to the gate of the nMOS transistor 22, and a constant current always flows as the nMOS transistor 22 is turned on by the gate voltage.

The nMOS transistor 24 has a source connected to ground, a drain connected to the pMOS transistor 23, and a gate connected to the gate and the drain of the nMOS transistor 22. The nMOS transistors 24 and 22 constitute a current mirror circuit. Therefore, a constant current of a level substantially equal to that or a current flowing in the nMOS transistor 22 flows through the nMOS transistor 24.

The pMOS transistor 23 has a source connected to the power supply, a drain connected to the nMOS transistor 24 and a gate connected to its own drain. A current substantially equal to the current flowing in the nMOS transistor 24 flows through the pMOS transistor 23, and a voltage proportional to the current is applied to the gate of the pMOS transistor 23.

The pMOS transistors 25 and 26 and the nMOS transistors 27 and 28 are connected in aeries between the power supply and ground. The pMOS transistor 25 has a source connected to the power supply, a drain connected to the nMOS transistor 26 and a gate connected to the output terminal of the OR gate 13. The nMOS transistor 28 has a source connected to ground, a drain connected to the nMOS transistor 27 and a gate connected to the output terminal of the AND gate 15. When the control signal RE is enabled to have an H level, or when it is not the period of the burst clock, an H-level signal is Supplied to the pMOS transistor 25 and an L-level signal is supplied to the nMOS transistor 28. Therefore, both transistors 25 and 28 are turned off. When the control signal RE is disabled to have an L level, or when it is the period of the burst clock, the pMOS transistor 25 and the nMOS transistor 26 are turned on and off in response to the clock S1.

Figure 5:
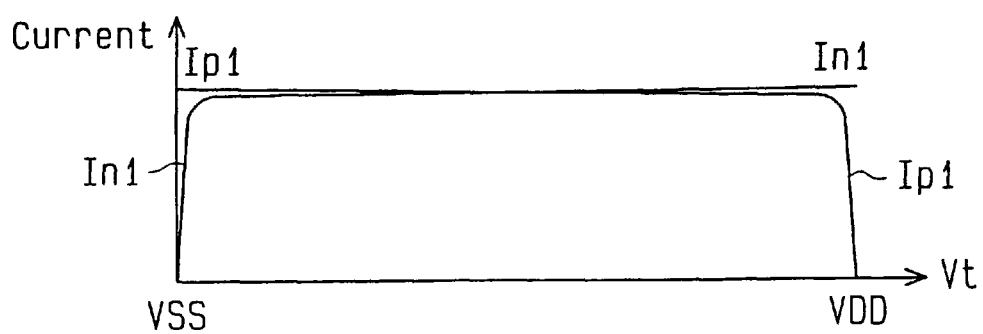
FIG. 5 is a graph illustrating the relationship between currents flowing in a charge pump circuit in the PLL circuit in FIG. 4 and the control voltage.

The pMOS transistor 26 has a source connected to the drain of the pMOS transistor 25, a drain connected to the LPF 30 and a gate connected to the gate of the pMOS transistor 23. When the pMOS transistor 25 is turned on. the pMOS transistor 26 operates to supply a constant current Ip1, substantially equal to the current which flows in the nMos transistor 22, to the LPF 30. The nMOS transistor 27 has a source connected to the drain of the nMOS transistor 28, a drain connected to the LPF 30 and a gate connected to the gate of the nMOS transistor 22. When the nMOS transistor 28 is on, the nMOS transistor 27 operates to acquire a constant current In1, substantially equal to the current which flows in the nMOS transistor 22, from the LPF 30. The pMOS transistor 26 and the nMOS transistor 27 preferably have relatively long channel lengths in order to prevent the occurrence of channel length modulation. Therefore, the currents Ip1 and In1 are substantially identical over the range from a ground potential $V_{SS}$ to a power supply potential $V_{DD}$, as shown in FIG. 5. The nMOS transistors 24 and 27 form a first current mirror circuit, and the pMOS transistors 23 and 26 form a second current mirror circuit.

The LPF 30 includes a resistor 31 and a pair of capacitors 32 and 33. The capacitors 32 and 33 perform charge and discharge actions to smooth the clock S1, producing a control voltage Vt. The capacitors 32 and 33 have large capacitances so that a variation in the control voltage Vt caused by the leak current from the capacitors 32 and 33 becomes smaller. The VCO 107 receives the control voltage Vt from the LPF 30, and outputs an oscillation clock Fv having a frequency proportional to the value of the control voltage Vt. In a color television of the NTSC system, the oscillation clock Fv has a frequency of 14.31818 MHZ, four times as high as the frequency of the burst clock Rc. The ¼ frequency divider 108 receives the oscillation clock Fv from the VCO 107, and produces the clock Pc, obtained by frequency-dividing the oscillation clock Fv by four. The clock Pc is supplied to the second input terminal of the XOR gate 101.

An A/D converter 109 receives the oscillation clock Fv from the VCO 107, and performs analog-to-digital conversion to generate a digital signal S2 by sampling a composite video signal CV according to the oscillation clock Fv.

The PLL circuit 10 of the first embodiment is suitable for suppressing a variation in the frequency of the oscillation clock Fv, caused by external factors, such as a temperature change, and outputting the oscillation clock Fv having a substantially constant frequency from the VCO 107. The charge pump circuit 20 is a steady-current type charge pump which controls the charge and discharge of the LPF 30 by the currents Ip1 and In1, which are substantially identical in level to each other. When the charge pump circuit 20 operates in response to the clock S1 having a duty ratio of 50% to charge or discharge the LPF 30, a constant control voltage Vt is output from the LPF 30. When the charge pump circuit 20 operates in response to the clock S1 having a duty ratio or over 50%, the control voltage Vt output from the LPF 30 risen. When the charge pump circuit 20 operates in response to the clock S1 having a duty ratio of less than 50%, the control voltage Vt output from the LPF 30 falls.

According to the first embodiment, even when the oscillation frequency from the VCO 107 varies. after the control voltage Vt output from the LPF 30 is changed to a second voltage from a first voltage, the charge and discharge of the LPF 30 are controlled by the substantially equal currents Ip1 and In1, so that the control voltage Vt is held at the second voltage. Therefore, a constant oscillation frequency is output from the VCO 107 and the duty ratio of the output clock S1 of the XOR gate 101 is held at 50%. That is, when the control voltage Vt is set to one hair the power supply potential, the ideal clock S1 with a duty ratio of 50% is obtained, as shown in FIG. 6B. Even when the control voltage Vt is set larger or smaller than one half the power supply potential, the clock S1 with a duty ratio of 50% is obtained, as shown in FIGS. 6A and 6C. In this manner, the phase of the oscillation clock Fv is maintained at the desired phase.

FIG. 7 is a block diagram of a PLL circuit 40 according to a second embodiment or the present invention. The PLL circuit 40 of the second embodiment has a charge pump circuit 41 different from the charge pump circuit 20 of the first embodiment. The charge pump circuit 41, which is a steady-current type charge pump, comprises pMOS transistors 25, 26, 42 and 44, nMOS transistors 27, 28, 45 and 43, and a resistor 43. the pMOS transistor 42 has a source connected to the power supply, a drain connected to ground via the resistor 43 and a gate connected to its own drain. A voltage resulting from voltage division in accordance with the ON resistance of the pMOS transistor 42 and the resistance of the resistor 43 is applied to the gate of the pMOS transistor 42, turning on the pMOS transistor 42, which allows the flow of a constant current.

The pMOS transistor 44 has a source connected to the power supply, a drain connected to the drain of the nMOS transistor 4S and a gate connected to the gate of the pMOS transistor 42. The pMOS transistor 44 together with the pMOS transistor 42 forms a current mirror circuit. Therefore, a constant current which has substantially the same level as the one flowing in the pMOS transistor 42 flows through the pMOS transistor 44.

The nMOS transistor 45 has a source connected to ground, a drain connected to the drain of the pMOS transistor 44 and a gate connected to its own drain. A constant current which hap substantially the same level as the one flowing in the pMOS transistor 44 flows through the nMOS transistor 45, and a voltage proportional to the current is applied to the gate of the nMOS transistor 45.

The pMOS transistors 25 and 26 and the nMOS transistors 27 and 28 are connected in series between the power supply and ground. The pMOS transistors 25 and 26 and the AMOS transistors 27 and 28 are the same as those in FIG. 4, The gate of the pMOS transistor 44 is connected to the gate of the pMOS transistor 26, and the gate of the nMOS transistor 45 is connected to the gate of tie nMOS transistor 27.

Figure 8:
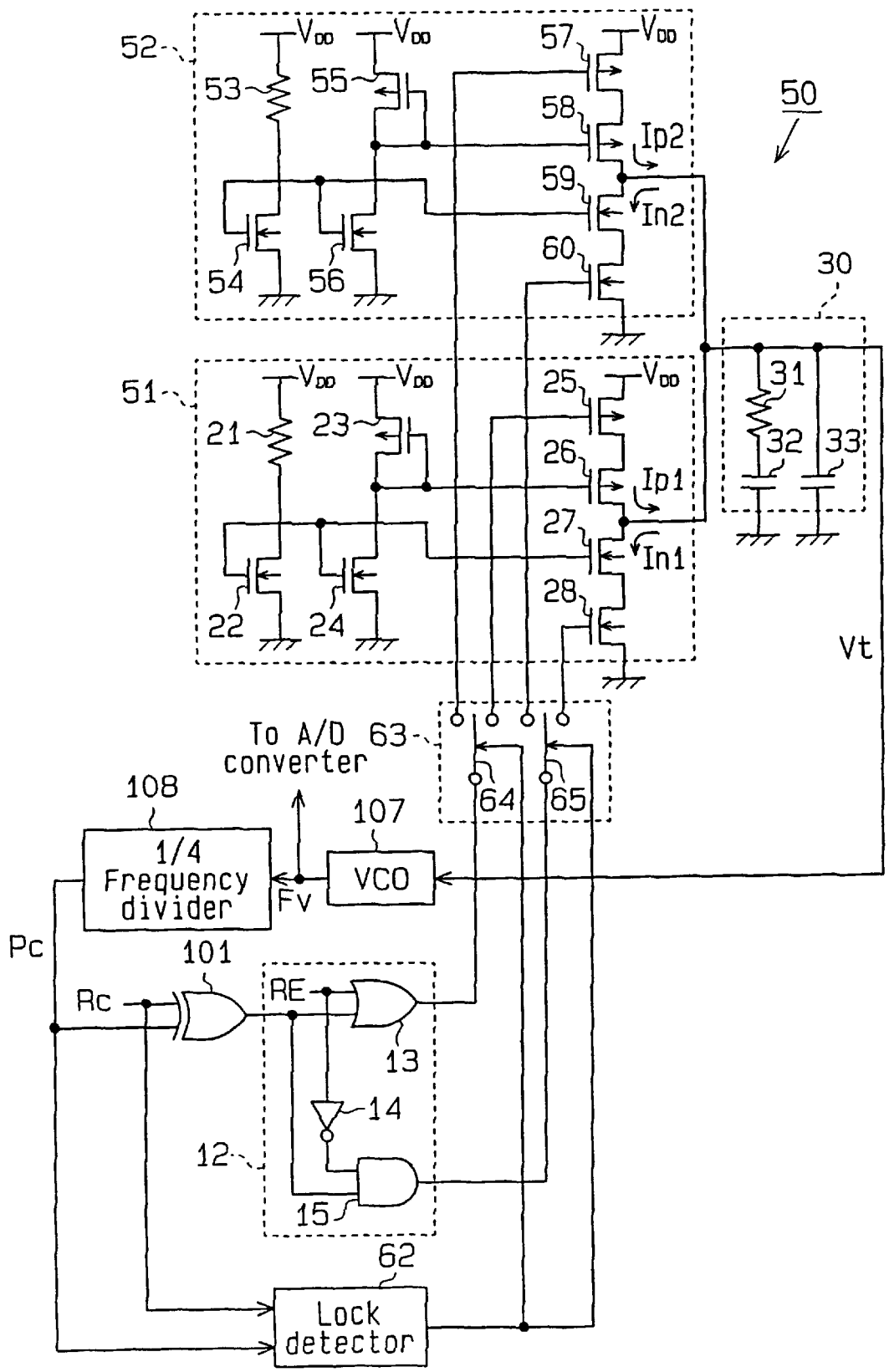
FIG. 8 is a schematic block diagram of a PLL circuit according to a third embodiment of the present invention.

FIG. 8 presents a block diagram of a PLL circuit 50 according to a third embodiment. The PLL circuit 50 of the third embodiment comprises the XOR gate 101, the tristate buffer 12, first and second charge pump circuits 51 and 52, the LPF 30, a lock detector 62, a selecting circuit 63, the VCO 107 and the ¼ frequency divider 10B.

The lock detector 62 receives the burst clock Rc and the clock Pc from the ¼ frequency divider 108, and detects if the phase of the clock Pc is locked with a phase difference of approximately 90° from the phase of the burst clock Rc. That is, the lock detector 62 detects if the oscillation clock FV is synchronous with the burst clock Rc.

The selecting circuit 63 selects one of the first and second charge pump circuits 51 and 52 in accordance with the detection result from the lock detector 62. The selecting circuit 63 includes a first selector 64 connected to the output terminal of the OR gate 13 and a second selector 65 connected to the output terminal of the AND gate 15. When the lock detector 62 determines that the clock Pc is not locked, the first and second Selectors 64 and 65 select the second charge pump circuit 52 and supply the output clock of the OR gate 13 and the output clock of the AND-gate 15 to the second charge pump circuit 52. When the lock detector 62 determines that the clock Pc is locked, the first and second selectors 64 and 65 select the first charge pump circuit 51 and supply the output clock of the OR gate 13 and the output clock of the AND gate 15 to the first charge pump circuit 51.

The first charge pump circuit 51 is the same steady-current type charge pump as the charge pump circuit 20 of the first embodiment. The gate of the pMOS transistor 25 in the charge pump circuit 51 is connected to the first terminal of the first selector 64, and the gate of the nMOS transistor 28 is connected to the first terminal of the second selector 65.

Figure 9:
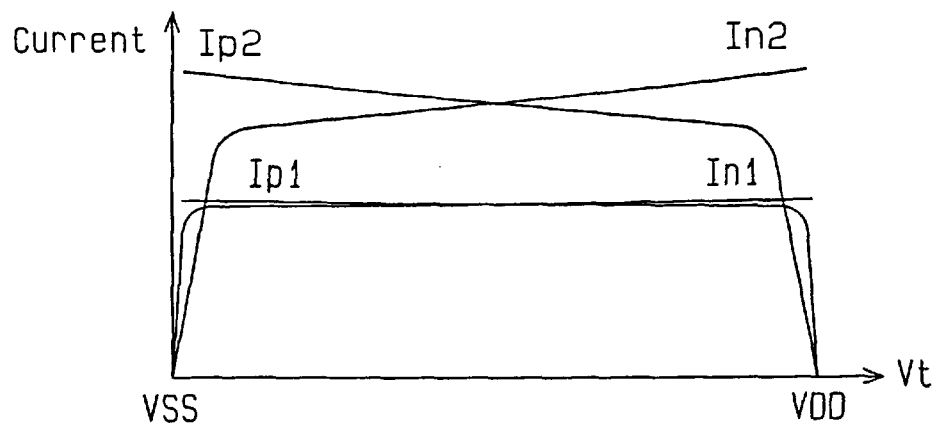
FIG. 9 is a graph illustrating the relationship between currents flowing in first and second charge pump circuits in the PLL circuit in FIG. 8 and the control voltage.

The second charge pump circuit 52 is a steady-current type charge pump which has a higher current driving capability than the first charge pump circuit S1. The second charge pump circuit 52 includes a resistor 53. nMOS transistors 54, 56, 59 and 60 and pMOS transistors 55, 57 and 58. The pMOS transistor 58 preferably has a short channel length to improve the current flowing performance and is designed to allow for slight channel length modulation. Therefore, a current Ip2 which flows through the pMOS transistor 58 decreases as the control voltage Vt increases, as shown in FIG. 9. The nMOS transistor 59 also preferably has a short channel length to improve the current flowing performance and is designed to allow for slight channel length modulation. Therefore, a current In2 which flows through the nMOS transistor 59 increases as the control voltage Vt increases, as shown in FIG. 9.

When the lock detector 62 detects the locking of the clock Pc due to the oscillation clock Fv being synchronous with the burst clock Rc in a composite video signal in one channel, the first and second selectors 64 and 65 select first charge pump circuit 51. Then, the output clock of the OR gate 13 is supplied to the pMOS transistor 25 and the output clock of the AND gate 15 is supplied to the nMOS transistor 28. The pMOS transistor 25 and the nMOS transistor 28 are alternately turned on and off in response to the output clock 31 having a duty ratio of 50% from the XOR gate 101. While the pMOS transistor 25 is met on, the LPF 30 is charged by the current Ip1 which flows in the pMOS transistor 26. While the nMOS transistor 28 is set on, the LPF 30 is discharged by the current In1 (=Ip1) which flows in the nMos transistor 27. Consequently, the control voltage Vt having a predetermined value is stably output from the LPF 30.

When the supply of the burst clock RC to the PLL circuit 50 is temporarily stopped for instance by switching the reception channel, the pMOS transistor 25 and the nMOS transistor 28 are both turned off by the H-level control signal RE, disabling the charge and discharge of the LPF 30. Consequently, the control voltage Vt falls due to a leak from the LPF 30, reducing the frequency of the oscillation clock Fv. Accordingly, the frequency of the, clock Pc output from the ¼ frequency divider 108 decreases too.

When the burst clock Rc is supplied again after a given time, the lock detector 62 determines that the clock Pc is unlocked. Then, the first and second selectors 64 and 65 select the second charge pump circuit 52 to supply the output clock of the OR gate 13 to the pMOS transistor 57 and the output clock of the AND gate 15 is supplied to the nMOS transistor 60. The pMOS transistor 57 and the nMOS transistor 60 are alternately turned on and off in response to the output clock S1 from the XOR gate 101. While the pMOS transistor 57 is set on, the LPF 30 is charged by the current Ip2 which flows in the pMOS transistor 58. While the nMOS transistor 60 is set on, the LPF 30 is discharged by the current In2 (=Ip2) which flows in the nMOS transistor 59. Au a result, the control voltage Vt output from the LPF 30 rapidly approaches the predetermined value. Thus, the oscillation clock Fv synchronous with the burst clock Rc is obtained quickly.

As the control voltage Vt approaches the predetermined value, the frequency of the oscillation clock Fv approaches a target frequency. At the same time, the frequency of the clock Pc output from the ¼ frequency divider 108 approaches the target frequency too. When the frequency of the clock Pc reaches the target frequency and the lock detector 62 detects the locked state of the clock Pc, the first and second selectors select the first charge pump circuit 51 in place of the second charge pump circuit 52. In this manner, the output clock of the OR gate 13 is supplied to the pMOS transistor 25 and the output clock of the AND gate 15 is supplied to the nMOS transistor 28. Consequently, the control voltage Vt having a predetermined value is stably output from the LPF 30 with suppressed ringing.

Figure 10:
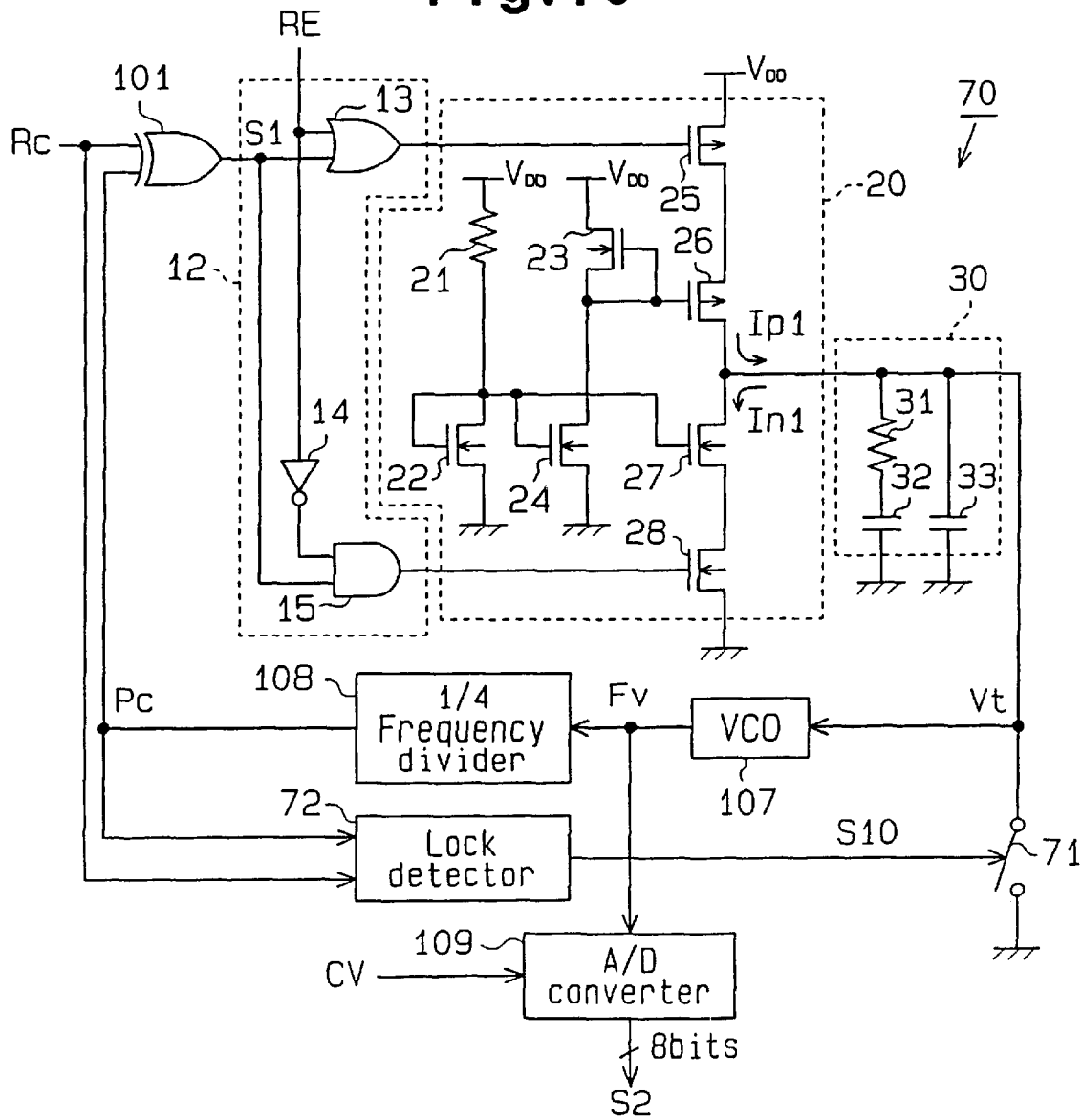
FIG. 10 is a schematic block diagram of a PLL circuit according to a fourth embodiment of the present invention.

FIG. 10 is a block diagram of a PLL circuit 70 according to a fourth embodiment of the present invention. The PLL circuit 70 of the fourth embodiment has a switch 71 and a lock detector 72 added to the PLL circuit 10 of the first embodiment. The lock detector 72 detects if the time in which the phase of the clock Pc is not locked with a phase difference of 90° from the phase of the burst clock Rc is equal to or greater than a predetermined time. That is, the lock detector 72 detects if the time in which the oscillation clock Fv is not synchronous with the burst clock Rc is equal to or greater than a predetermined time. When detecting the unlocked state of the clock Pc, the lock detector 72 outputs an unlock detection signal S10. In the present embodiment, the lock detector 72 output signal S10 comprises a single pulse output.

The switch 71, provided between the LPF 30 and ground, is switched on in response to the unlock detection signal S from the lock detector 72, grounding the output of the LPF 30. This forces the control voltage Vt to fall to the ground potential $V_{SS}$, thus resetting the PLL circuit 70. When the unlock detection signal S10 is disabled, the switch 71 is switched off to disconnect the output of the LPF 30 from the ground.

Figure 11:
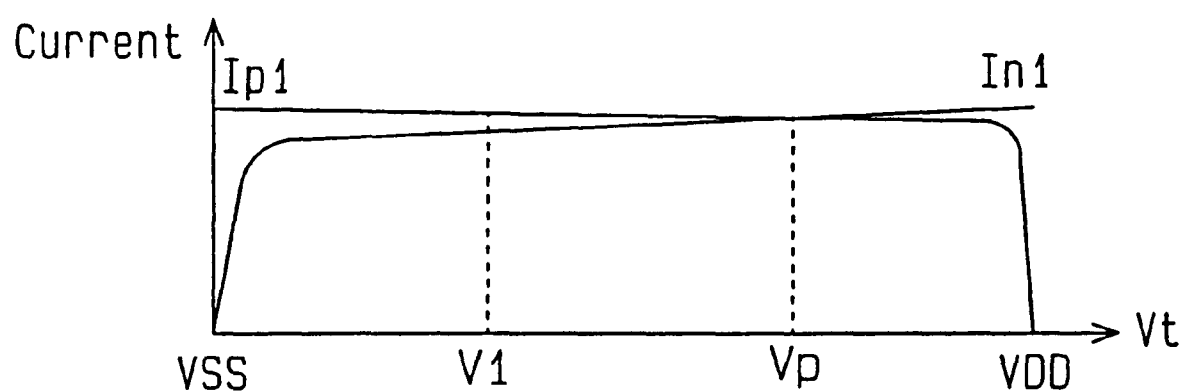
FIG. 11 is a graph illustrating the relationship between currents flowing in a charge pump circuit and the control voltage in the PLL circuit of FIG. 10.

As shown in FIG. 11, the current characteristic of the pMOS transistor 26 and the current characteristic of the nMOS transistor 27 in the steady-current type charge pump circuit 20 are not, strictly speaking, symmetrical over the range from the ground potential $V_{SS}$ to the power supply potential $V_{DD}$. Specifically, the current Ip1 of the pMOS transistor 26 becomes slightly larger than the current In1 of the nMOS transistor 27. In this case, the clock Pc may not be locked with respect to a change in the input frequency in a step response like switching of the reception channel. That is, due to the large capacity of the LPF 30 and the narrow capture range, the control voltage Vt from the LPF 30 is trapped to a voltage value Vp at which Ip1=In1 and the voltage value V1 of the control voltage Vt will not reach a lock point V1.

According to the fourth embodiment, when the unlocked state of the clock Pc continues for a predetermined time or longer in the step response, the switch 71 is switched on in response to the unlock detection signal S10 from the lock detector 72 to forcibly drop the control voltage Vt down to the ground potential $V_{SS}$. Then, the frequency of the oscillation clock Fv falls, reducing the frequency of the clock Pc output from the ¼ frequency divider 108. The pMOS transistor 25 and the nMOS transistor 29 are alternately turned on and off in response to the output clock S1 of the XOR gate 101, so that the LPF 3D is charged by the current Ip1 and discharged by the current Ip2. As a result, the control voltage Vt rises from the ground potential $V_{SS}$ and reaches the voltage V1, locking the clock Pc so that the oscillation clock Fv is synchronized with the burst clock Rc.

In the fourth embodiment, the switch 71 may alternately be provided between the input terminal of the LPF 30 and ground. In this case too the LPF 30 is selectively reset by the operation of the switch 71.

The PLL circuit 70 of the fourth embodiment may be modified to have the switch 71 and the lock detector 72 added to the PLL circuit 40 of the second embodiment (FIG. 7). In this case, the current In1 of the nMOS transistor 27 becomes slightly greater than the current Ip1 of the pMOS transistor 26 over the range from the ground potential $V_{SS}$ to the power supply potential $V_{DD}$. It is therefore preferable to provide the switch 71 between the power supply $V_{DD}$ and the LPF 30. That is, when the unlocked state of the clock Pc continues for a predetermined time or longer, the switch 71 is switched on in response to the one-shot unlock detection signal S10 from the lock detector 72 to forcibly increase the control voltage Vt to the power supply potential $V_{DD}$. Thereafter, an the control voltage Vt falls from the power supply potential $V_{DD}$ and the clock Pc is locked at a predetermined voltage, the oscillation clock Fv is synchronized with the burst clock Rc.

Figure 12:
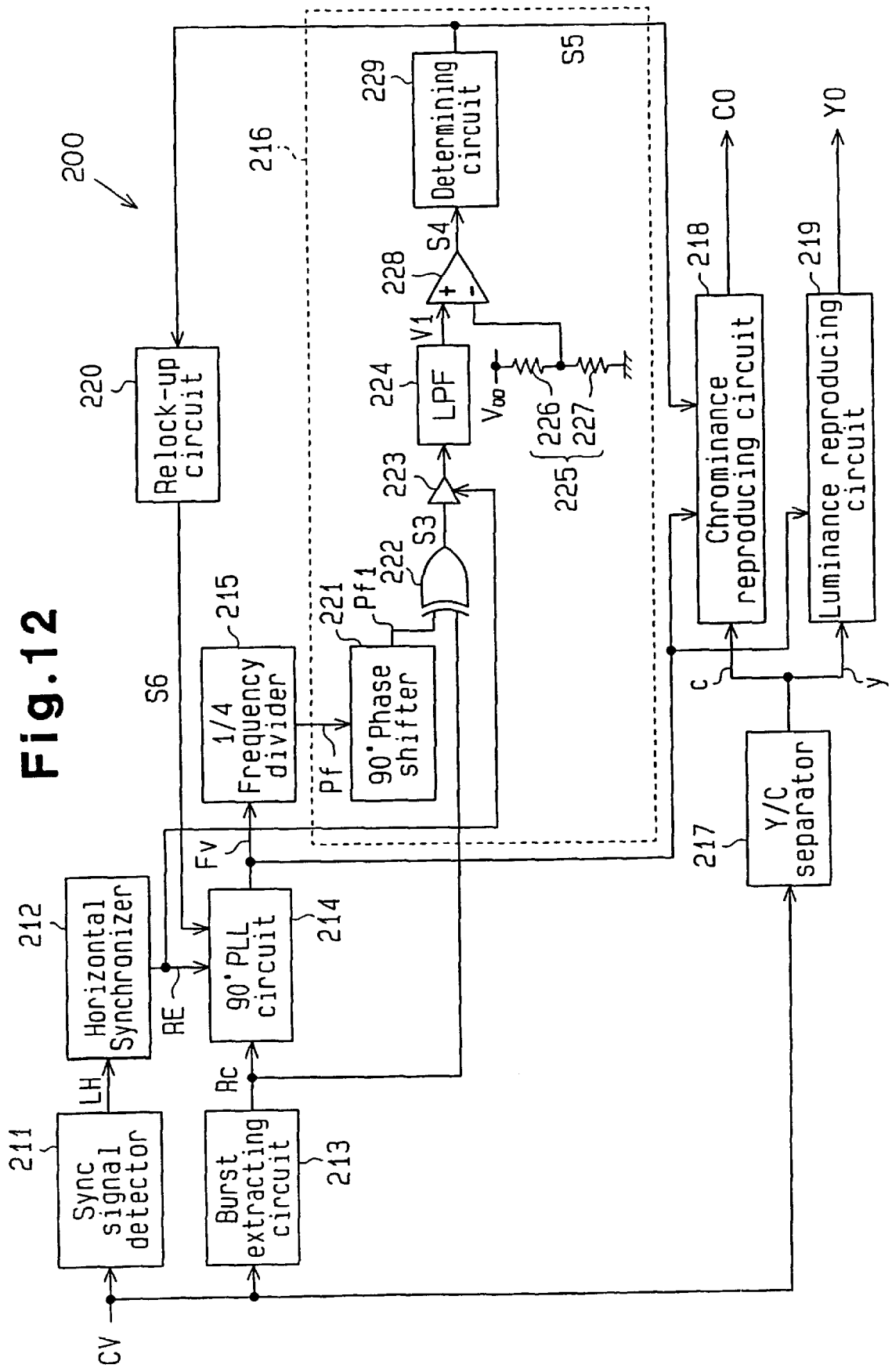
FIG. 12 is a schematic block diagram of an image signal processing apparatus according to one embodiment.

FIG. 12 is a block diagram showing at image signal processing apparatus 200 in a television receiver according to the present invention. The image signal processing apparatus 200 comprises a sync signal detector 211, a horizontal synchronizer 212, a burst extracting circuit 213, a 90° PLL circuit 214, a ¼ frequency divider 215, a lock detector 216, a Y/C separator 217, a chrominance reproducing circuit 218, a luminance reproducing circuit 219, and a relock-up circuit 220.

The sync signal detector 211 extracts a sync component from the composite video signal CV using a difference between the amplitude of the sync component and the amplitudes of other signal components, and separates the sync component to a horizontal sync component and a vertical sync component using a frequency difference. The horizontal synchronizer 212 receives the horizontal sync component from the sync signal detector 211 and generates a horizontal sync signal and the control signal RE corresponding to the period of the burst clock Rc.

The burst extracting circuit 213 selectively extracts the burst clock Rc from the composite video signal CV for synchronization of the chrominance component. The burst clock Rc has a fixed pattern with a predetermined frequency (e.g., 3.58 MHZ) and a predetermined amplitude. The burst clock RC is superimposed at a predetermined position in the composite video signal CV, e.g., at the beginning of each horizontal scan period. In this respect, the burst clock Rc is selectively extracted at the beginning of each horizontal scan period of the composite video signal CV.

The 90° PLL circuit 214 receives the burst clock RC from the burst extracting circuit 213 and produces the oscillation clock Fv which is used for a sampling clock for a chrominance signal in accordance with the control signal RE from the horizontal synchronizer 212. In the NTSC system, for example, the 90° PLL circuit 214 is designed so that a clock obtained by frequency-dividing the oscillation clock Fv by four is synchronous with the burst clock RC. That is, the oscillation clock FV of 14.32 MHZ is produced with respect to the burst clock Rc of 3.58 MHZ. The ¼ frequency divider 215 generates a clock Pf obtained by frequency-dividing the frequency of the oscillation clock Fv by four, and sends the clock Pf to the lock detector 216.

The lock detector 216 produces a shift clock Pf1 which is the clock Pf whose phase is delayed by 90°, and compares the phase of the burst clock Rc with that of the shift clock Pf1. Based on the comparison result, the lock detector 216 determines whether or not the oscillation clock Fv is synchronous with the burst clock Rc. The lock detector 216 includes a 90° phase shifter 221, an XOR gate 222, a tristate buffer 223, an LPF 224, a reference voltage generator 225, a comparator 228 and a determining circuit 229.

The 90° phase shifter 221 receives the output clock Pf from the ¼ frequency divider 215 and produces the shift clock Pf1 which is the output clock Pf whose phase is delayed by 90°. The XOR gate 222 receives the burst clock (reference clock) Rc and the shift clock Pf1, compares the phase of the burst clock Rc with that of the shift clock Pf1, and outputs a clock S3 indicative of the comparison result.

The tristate buffer 223 supplies the output clock S3 from the XOR gate 222 to the LPF 224 when the control signal RE from the horizontal synchronizer 212 is enabled, and sets its output in a high impedance state when the control signal RE is disabled. The LPF 224 is charged and discharged by the output clock S3 and supplies a voltage V1 to the comparator 228. The reference voltage generator 225 includes a pair of resistors 226 and 227 connected in series between the Dower supply potential and ground. The reference voltage generator 225 divides a voltage between the ground potential $v_{SS}$ and the power supply potential $V_{DD}$ by the resistance ratio of the resistors 226 and 227 and outputs a reference voltage VR from the node between the resistors 226 and 227.

The comparator 228 has a positive (non-inverting) Input terminal for receiving the output voltage V1 from the LPF 224 and a negative (inverting) input terminal for receiving the reference voltage VR. The comparator 228 compares the voltage V1 with the reference voltage VR and sends a comparison signal S4 to the determining circuit 229. The comparison signal S4 of an L level is output when the voltage V1 is equal to or less than the reference voltage VR, and the comparison signal S4 of an H level is output when the voltage V1 is greater than the reference voltage VR.

In accordance with the comparison signal S4, the determining circuit 229 determines if the oscillation clock Fv has a phase difference of 90° with respect to the burst clock Rc (or is synchronous with the latter). When the oscillation clock Fv is not synchronous with the burst clock Rc, a decision signal 85 is enabled. In the presently preferred embodiment, it is determined that the oscillation clock Fv is synchronous with the burst clock Rc when the L-level comparison signal S4 is output, and that the oscillation clock Fv is not synchronous with the burst clock Rc when the H-level comparison signal S4 is output.

The relock-up circuit 220 receives the decision signal S5 from the determining circuit 229, and enables a relock-up trigger signal S6 when the oscillation clock Fv is asynchronous with the burst clock Rc. In response to an active relock-up trigger signal S6, the 90° PLL circuit 214 operates to synchronize the oscillation clock Fv with the burst clock RC.

The Y/C separator 217 receives the composite video signal CV, which contains a luminance component and a chrominance component, separates the composite video signal CV into the luminance component and chrominance component to produce a chrominance signal c and a luminance signal y by unpins the phase difference of the chrominance component. In the NTSC system, for example, the luminance component is acquired by shifting the composite video signal CV by one horizontal scan period and adding the composite video signal CV and the shifted composite video signal together, The chrominance component is acquired from the difference between the composite video signal CV and the shifted composite video signal.

When the decision signal S5 is inactive, the chrominance reproducing circuit 218 amplifies the chrominance signal c to produce a chrominance signal having a predetermined amplitude. The chrominance reproducing circuit 218 quantizes the chrominance signal using the oscillation clock Fv as a sampling clock, thereby reproducing chrominance data CO. When the decision signal 55 is active, the chrominance reproducing circuit 218 interrupts the reproduction of the chrominance data CO and outputs a fixed value (e.g., "0").

The luminance reproducing circuit 219 includes a high frequency amplifier of a video band, and amplifies the luminance signal y to produce a luminance signal y having a predetermined amplitude. Further, the luminance reproducing circuit 219 quantizes the luminance signal y in accordance with a predetermined Sampling clock to reproduce luminance data Y0.

Figure 13:
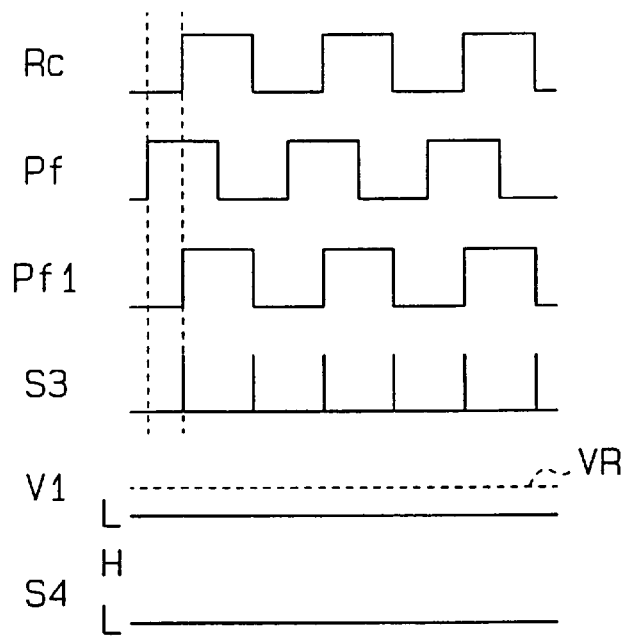
FIG. 13 is a waveform chart illustrating the operation of a lock detector in the image signal processing apparatus in FIG. 12.

When the phase of the clock Pf leads the phase of the burst clock Rc by nearly 90°, as shown in FIG. 13, the 90° phase shifter 221 outputs the shift clock Pf1 having the same phase as that of burst clock Rc. Accordingly, the XOR gate 222 outputs the output clock S3 of substantially an L level. That is, the output clock S3 having a very short H-level period is output. Consequently, the LPF 224 outputs the L-level voltage V1, and the comparator 228 outputs the L-level comparison signal S4. In this manner, the determining circuit 229 detects whether the oscillation clock Fv is synchronous with the burst clock Rc.

Figure 14:
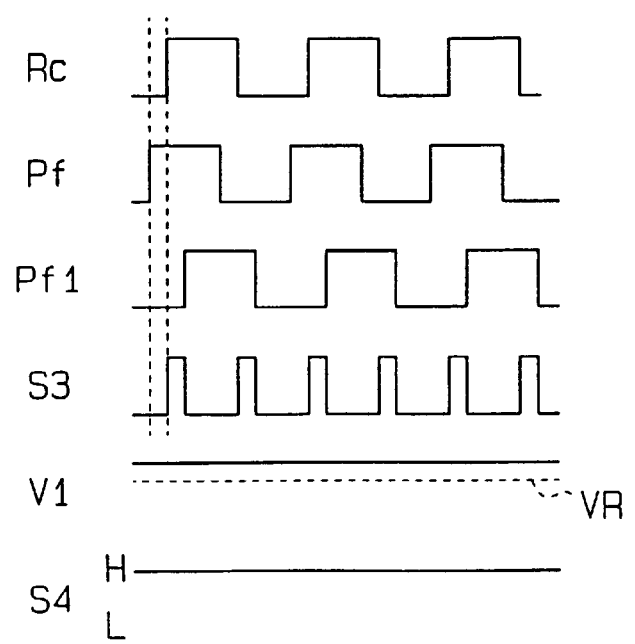
FIG. 14 is a waveform chart illustrating the operation of the lock detector in the image signal processing apparatus in FIG. 12.

When the phase difference between the clock Pf and the burst clock Rc is not 90°, as shown in FIG. 14, the 90° phase shifter 221 does not output the shift clock Pf1 having the same phase as that of burst clock Rc. As a result, the XOR gate 222 outputs the output clock S3 which provides a pulse in a period during which one of the burst clock Rc and the shift clock PF1 has an H level and the other clock has an L level. As the voltage V1 from the LPF 224 is proportional to the duty ratio of the output clock S3, the voltage V1 output from the LPF 224 rises. When the voltage V1 becomes greater than the reference voltage VR, the comparator 220 outputs the H-level comparison signal S4. Thus, the determining circuit 229 detects that the oscillation clock Fv is not synchronous with the burst clock Rc.

Although the present invention is embodied in the lock detector which detects if the oscillation clock Fv, produced based on the burst clock Rc, contained in the composite video signal CV as a reference clock, is synchronous with the burst clock Rc, this is in no way restrictive; for example, the lock detector may detect if an oscillation clock, which is produced based on an arbitrary clock, as a reference clock, different from the burst clock, is synchronous with that clock.

It should be apparent to those skilled in the art that the present invention may be embodied in many other specific forms without departing from the spirit or scope of the invention. For example, the present invention may be adapted to a PLL circuit which outputs an oscillation clock which is synchronized with a reference clock other than the burst clock. Further, the present invention may be adapted to a lock detector which detects if an oscillation clock is synchronized with a reference clock other than the burst clock.

Therefore, the present examples and embodiments are to be considered as illustrative and not restrictive and the invention is not to be limited to the details given herein, but may be modified within the scope and equivalence of the appended claims.

What is claimed is:

1. A phase locked loop (PLL) circuit for generating an oscillation clock which maintains a substantially constant phase difference with respect to a phase of a reference clock, comprising:

a voltage controlled oscillator receiving a control voltage and producing an oscillation clock having a frequency corresponding to the control voltage;

a comparison circuit receiving the reference clock and the oscillation clock and comparing phases of the reference clock and the oscillation clock with each other to produce a comparison signal indicative of a comparison result;

a charge pump circuit, connected to said comparison circuit, a ground potential and a power supply potential, for receiving the comparison signal, and selecting one of the ground potential and the power supply potential in response to the comparison signal, wherein the charge pump pulls a constant current to ground from an output terminal of the charge pump circuit when the ground potential is selected and supplies a constant current to the output terminal of the charge pump circuit when the power supply potential is selected, thereby producing an output which alternately repeats the ground potential and the power supply potential; and a low-pass filter, connected between said charge pump circuit and said voltage controlled oscillator, for smoothing the output of the charge pump circuit to produce the control voltage, wherein said charge pump circuit includes:

first and second transistors each having a source, a drain and a gate, wherein the first and second transistors are alternately turned on and off in response to the comparison signal applied to their gates;

a constant current source for supplying a constant current;

a first current mirror circuit, connected between the drain of said first transistor and the output terminal of the charge pump circuit, for allowing flow of a constant drive current according to the constant current of said constant current source when said first transistor is turned on; and a second current mirror circuit, connected between the drain of said second transistor and the output terminal of the charge pump circuit, for allowing flow of a constant drive current according to the constant current of the constant current source when the second transistor is turned on.

2. The PLL circuit according to claim 1, wherein the reference clock includes a burst clock in a composite video signal.

3. A phase locked loop (PLL) circuit for generating an oscillation clock which maintains a substantially constant phase difference with respect to a phase of a reference clock, comprising:

a voltage controlled oscillator receiving a control voltage and producing an oscillation clock having a frequency corresponding to the control voltage;

a comparison circuit receiving the reference clock and the oscillation clock and comparing phased of the reference clock and the oscillation clock with each other to produce a comparison signal indicative of a comparison result;

a first charge pump circuit, connected to said comparison circuit, a ground potential and a power supply potential, for receiving the comparison signal, and selecting one of the ground potential and the power supply potential in response to the comparison signal, wherein the first charge pump circuit pulls a constant current to ground from an output terminal of the first charge pump circuit when the ground potential is selected and supplies a constant current to the output terminal of the first charge pump circuit when the power supply potential is selected, thereby producing a first output which alternately repeats the ground potential and the power supply potential;

a second charge pump circuit, connected to the comparison circuit, a ground potential and a power supply potential and having a drive performance with a higher output load than the first charge pump circuit, for receiving the comparison signal, and selecting one of the ground potential and the power supply potential in response to the comparison signal, wherein the second charge pump circuit pulls a constant current to ground from an output terminal of the second charge pump circuit when the ground potential is selected and supplies a constant current to the output terminal of the second charge pump circuit when the power supply potential is selected, thereby producing a second output which alternately repeats the ground potential and the power supply potential;

a low-pass filter, connected between said first and second charge pump circuits and said voltage controlled oscillator, for smoothing one of the first and second outputs of the first and second charge pump circuits to produce the control voltage;

a look detector receiving the reference clock and the oscillation clock, detecting if the oscillation clock maintains a substantially constant phase difference with respect to the phase of the reference clock and producing a detection signal indicative of a detection result; and a selecting circuit, connected to said first and second charge pump circuits and responsive to the detection signal, for operating said first charge pump circuit when the oscillation clock maintains the substantially constant phase difference with respect to the phase of the reference clock and operating said second charge pump circuit when the oscillation clock does not maintain the substantially constant phase difference with respect to the phase of the reference clock.

4. The PLL circuit according to claim 3, wherein the reference clock includes a burst clock in a composite video signal.

5. The PLL circuit according to claim 3, wherein each of the first and second charge pump circuits includes:

first and second transistors which are alternately turned on and off in response to the comparison signal;

a constant current source for supplying a constant current;

a first current mirror circuit, connected between said first transistor and the output terminal of the charge pump circuit, for allowing flow of a constant drive current according to the constant current of said constant current source when said first transistor is turned on; and a second current mirror circuit, connected between said second transistor and the output terminal of the charge pump circuit, for allowing flow of a constant drive current according to the constant current of said constant current source when the second transistor is turned on.

6. A phase locked loop (PLL) circuit for generating an oscillation clock which maintains a substantially constant phase difference with respect to a phase of a reference clock, comprising:

a voltage controlled oscillator receiving a control voltage and producing an oscillation clock having a frequency corresponding to the control voltage;

a comparison circuit receiving the reference clock and the oscillation clock and comparing phases of the reference clock and the oscillation clock with each other to produce a comparison signal indicative of a comparison result;

a charge pump circuit, connected to said comparison circuit, a ground potential and a power supply potential, for receiving the comparison signal, and selecting one of the ground potential and the power supply potential in response to the comparison signal, wherein the charge pump circuit pulls a constant current to ground from an output terminal of the charge pump circuit when the ground potential is selected and supplies a constant current to the output terminal of the charge pump circuit when the power supply potential is selected, thereby producing an output which alternately repeats the ground potential and the power supply potential;

a low-pass filter, connected between said charge pump circuit and said voltage controlled oscillator, for smoothing the output of the charge pump circuit to produce the control voltage;

a lock detector for receiving the reference clock an the oscillation clock, detecting if the oscillation clock maintains a substantially constant phase difference with respect to the phase of the reference clock and producing a detection signal when the oscillation clock does not maintain a substantially constant phase difference with respect to the phase of the reference clock for at least a predetermined period; and a switch, connected to one of the input and output of said low-pass filter and responsive to the detection signal from said lock detector, the switch operating to supply one of the ground potential and the power supply potential to one of the input and output of said low-pass filter.

7. The PLL circuit according to claim 6, wherein the reference clock includes a burst clock in a composite video signal.

\* \* \* \* \*